(12) United States Patent
Wu et al.

(10) Patent No.: US 9,842,850 B2
(45) Date of Patent: Dec. 12, 2017

(54) HIGH-K-LAST MANUFACTURING PROCESS FOR EMBEDDED MEMORY WITH SILICON-OXIDE-NITRIDE-OXIDE-SILICON (SONOS) MEMORY CELLS

(71) Applicant: Taiwan Semiconductor Manufacturing Co., Ltd., Hsin-Chu (TW)

(72) Inventors: Wei Cheng Wu, Zhubei (TW); I-Ching Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/983,686

(22) Filed: Dec. 30, 2015

(65) Prior Publication Data

US 2017/0194334 A1 Jul. 6, 2017

(51) Int. Cl.
*H01L 21/28* (2006.01)
*H01L 21/321* (2006.01)
(Continued)

(52) U.S. Cl.
CPC .... *H01L 27/1157* (2013.01); *H01L 21/28282* (2013.01); *H01L 21/32115* (2013.01); *H01L 21/32133* (2013.01); *H01L 27/11573* (2013.01); *H01L 29/495* (2013.01); *H01L 29/4916* (2013.01); *H01L 29/4966* (2013.01); *H01L 29/517* (2013.01); *H01L 29/66545* (2013.01)

(58) Field of Classification Search
CPC ........... H01L 27/115; H01L 29/792; H01L 27/11568; H01L 27/11521; H01L 27/105; H01L 29/66545; H01L 29/66833; H01L 21/28282; H01L 27/11563–27/11575
See application file for complete search history.

(56) References Cited

U.S. PATENT DOCUMENTS 7,611,941 B1 * 11/2009 Shum ............... H01L 21/28273
257/E21.179
8,883,624 B1 11/2014 Ramkumar
(Continued)

OTHER PUBLICATIONS

U.S. Appl. No. 14/984,034, filed Dec. 30, 2015.
(Continued)

*Primary Examiner* — Marcos D Pizarro
*Assistant Examiner* — Long H Le
(74) *Attorney, Agent, or Firm* — Eschweiler & Potashnik, LLC

(57) ABSTRACT

An integrated circuit (IC) using high-κ metal gate (HKMG) technology with an embedded silicon-oxide-nitride-oxide-silicon (SONOS) memory cell is provided. A logic device is arranged on a semiconductor substrate and comprises a logic gate. The logic gate is arranged within a high κ dielectric layer. A memory cell is arranged on the semiconductor substrate and comprises a control transistor and a select transistor laterally adjacent to one another. The control and select transistors respectively comprise a control gate and a select gate. The control transistor further comprises a charge trapping layer underlying the control gate. The control and select gates are a first material, and the logic gate is a second material. A high-κ-last method for manufacturing the IC is also provided.

19 Claims, 11 Drawing Sheets

(51) Int. Cl.
*H01L 21/3213* (2006.01)
*H01L 27/115* (2017.01)
*H01L 29/51* (2006.01)
*H01L 29/49* (2006.01)
*H01L 29/66* (2006.01)
*H01L 27/1157* (2017.01)
*H01L 27/11573* (2017.01)

(56) References Cited

U.S. PATENT DOCUMENTS

| | | |
|---|---|---|
| 2006/0261398 A1 | 11/2006 | Lee |
| 2008/0173944 A1* | 7/2008 | Coronel ............... H01L 27/1207 257/351 |
| 2013/0264652 A1 | 10/2013 | Zhu |
| 2014/0024183 A1* | 1/2014 | Hsu .................... H01L 27/0629 438/241 |
| 2014/0073126 A1 | 3/2014 | Shen et al. |
| 2014/0374814 A1* | 12/2014 | Wu ................... H01L 27/11568 257/326 |
| 2015/0054049 A1* | 2/2015 | Perera ............... H01L 21/28273 257/316 |
| 2015/0093864 A1* | 4/2015 | Perera ............... H01L 21/28273 438/257 |
| 2015/0108475 A1 | 4/2015 | Ando et al. |
| 2015/0236034 A1 | 8/2015 | Toh |
| 2015/0249145 A1* | 9/2015 | Yoshimori ........ H01L 29/66545 438/275 |
| 2015/0279854 A1* | 10/2015 | Hall .................. H01L 29/66545 438/591 |
| 2015/0311221 A1 | 10/2015 | Huang |
| 2016/0013313 A1 | 1/2016 | Cheng et al. |
| 2016/0126327 A1* | 5/2016 | Chen ................... H01L 29/4916 257/326 |

OTHER PUBLICATIONS

U.S. Appl. No. 14/984,095, filed Dec. 30, 2015.
U.S. Appl. No. 14/983,682, filed Dec. 30, 2015.
Non Final Office Action dated Oct. 6, 2016 U.S. Appl. No. 14/984,095.
Non Final Office Action dated Jan. 27, 2017 U.S. Appl. No. 14/984,095.
Non Final Office Action dated Nov. 3, 2016 U.S. Appl. No. 14/983,682.
Final Office Action dated Apr. 27, 2017 in regards to U.S. Appl. No. 14/984,095.
Notice of Allowance dated Jun. 5, 2017 in regards to U.S. Appl. No. 14/984,034.
Notice of Allowance dated Mar. 31, 2017 for U.S. Appl. No. 14/983,682.
Notice of Allowance dated Jul. 27, 2017 in connection with U.S. Appl. No. 14/984,095.

* cited by examiner

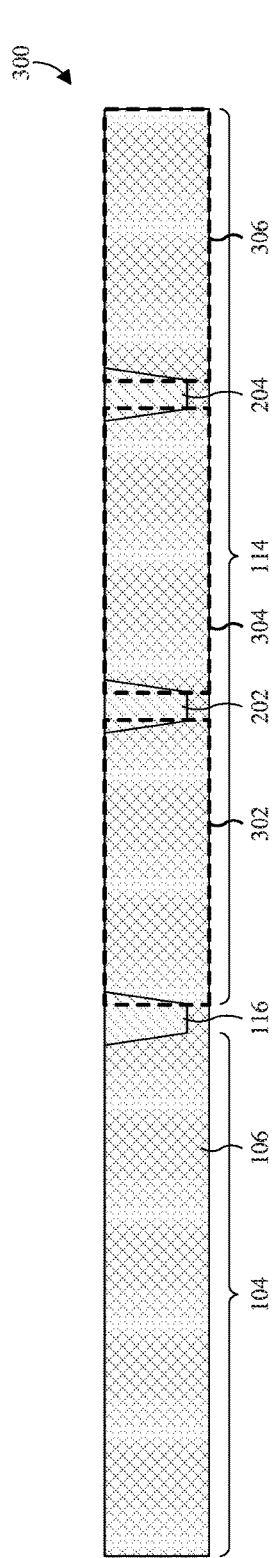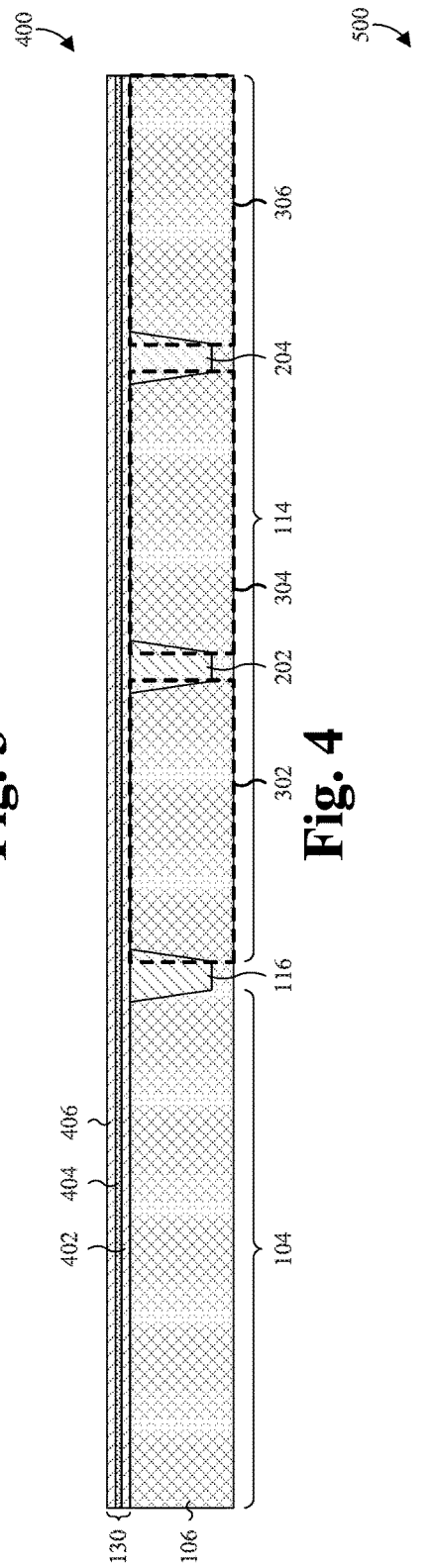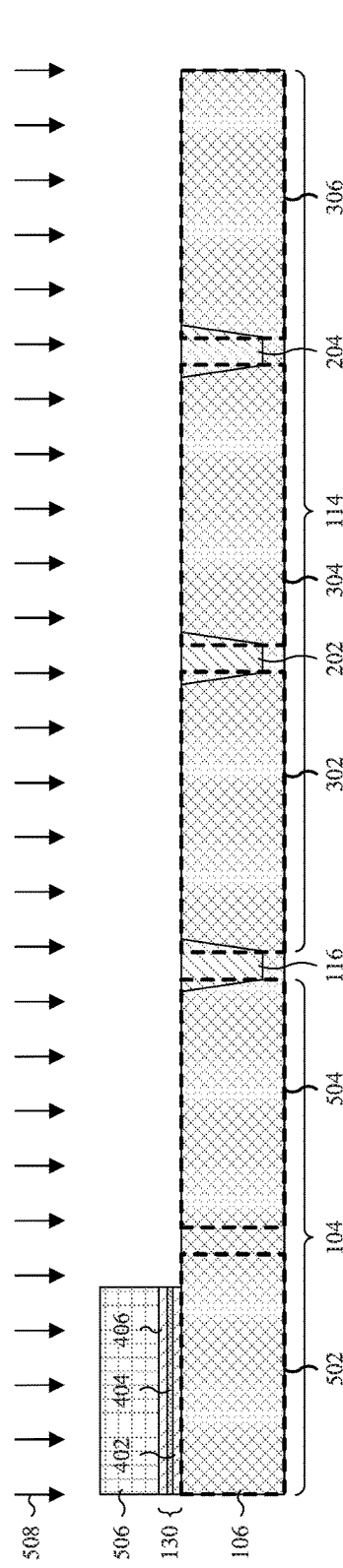

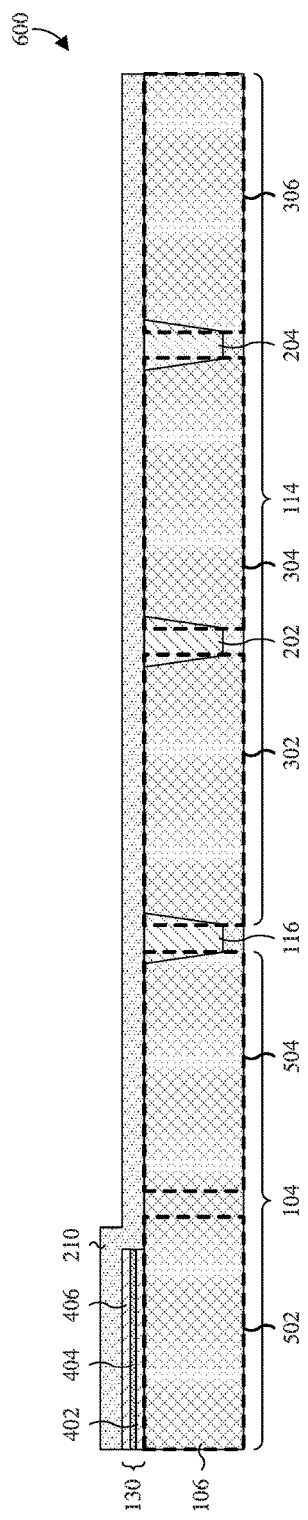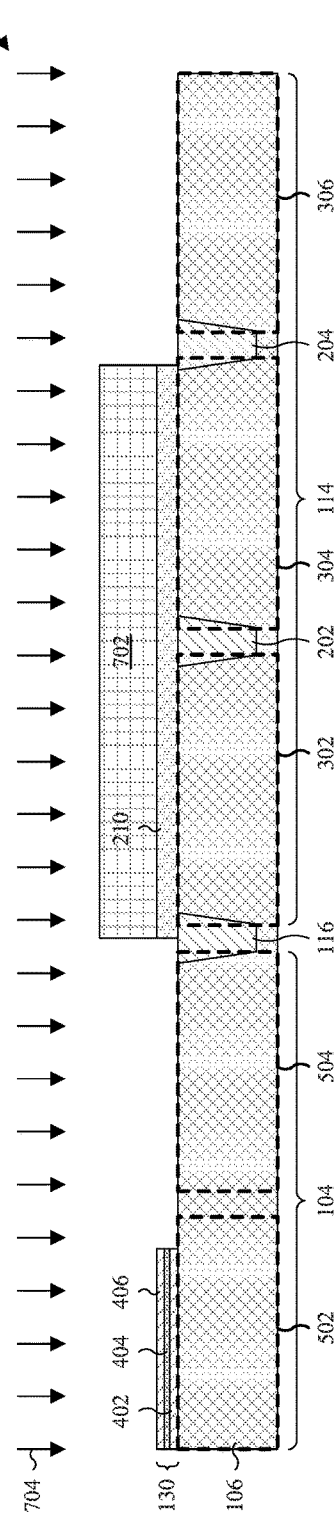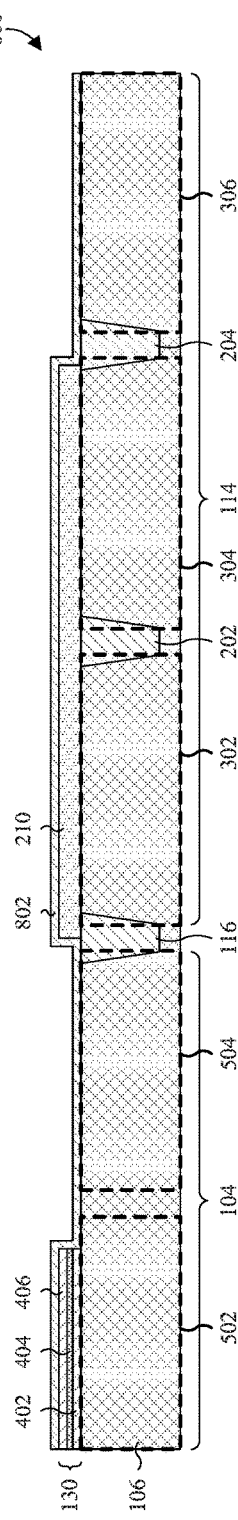

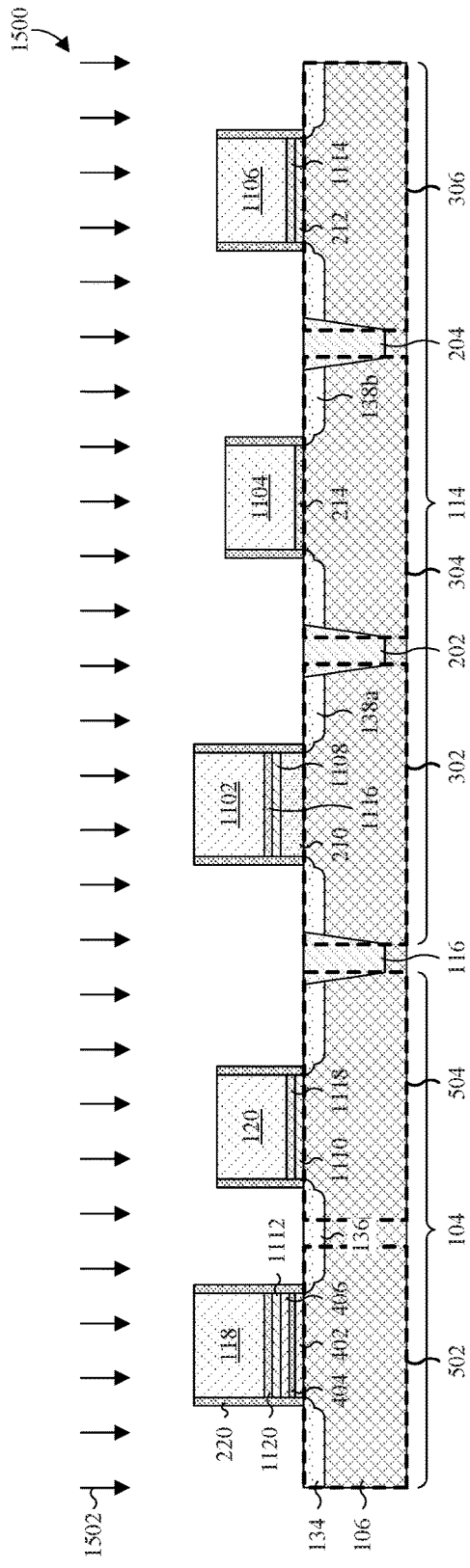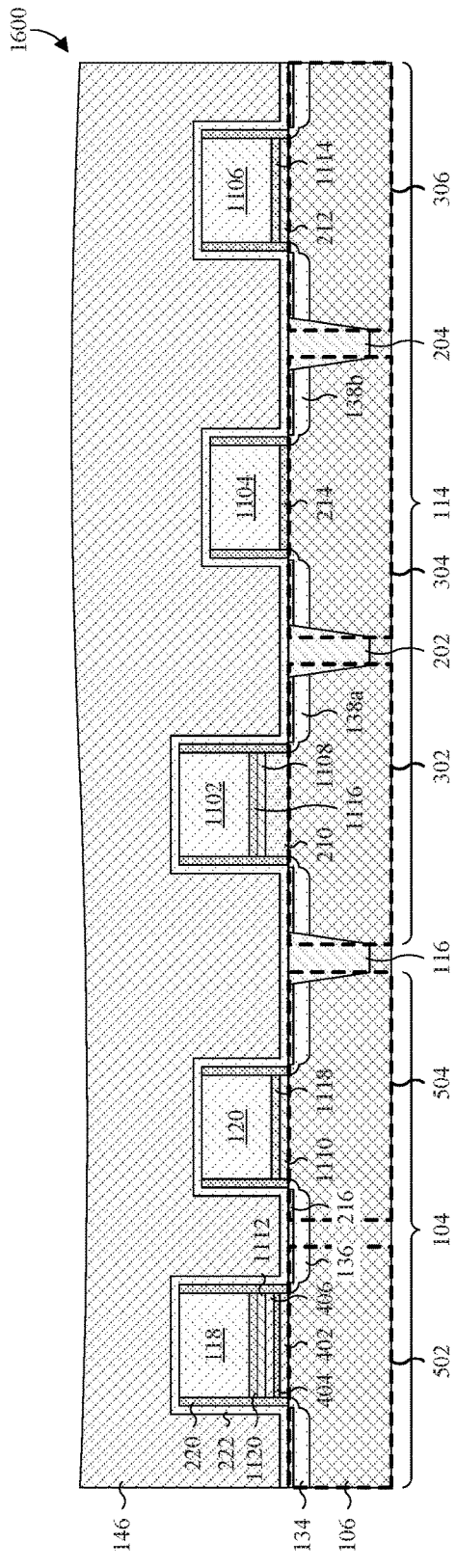

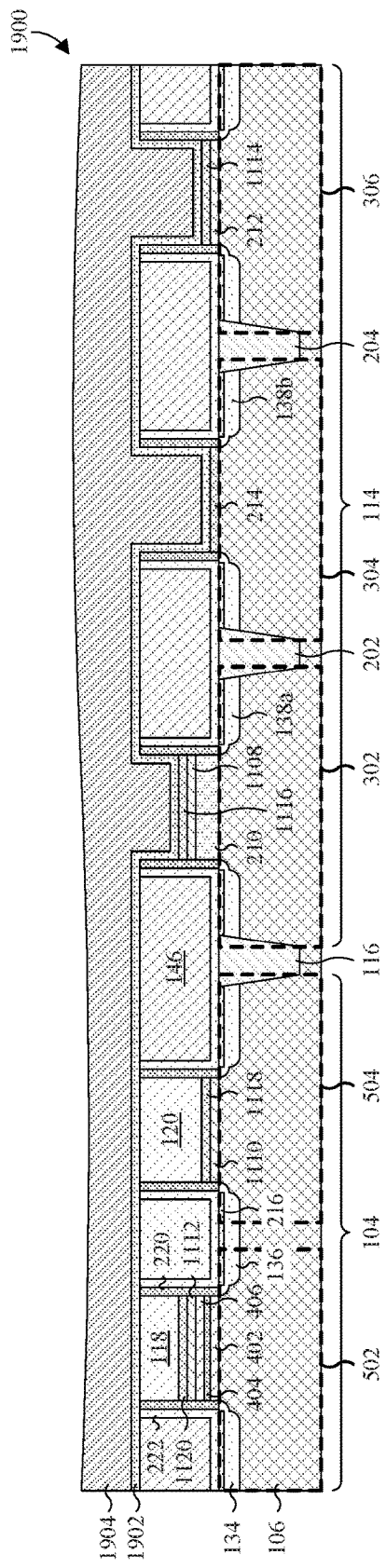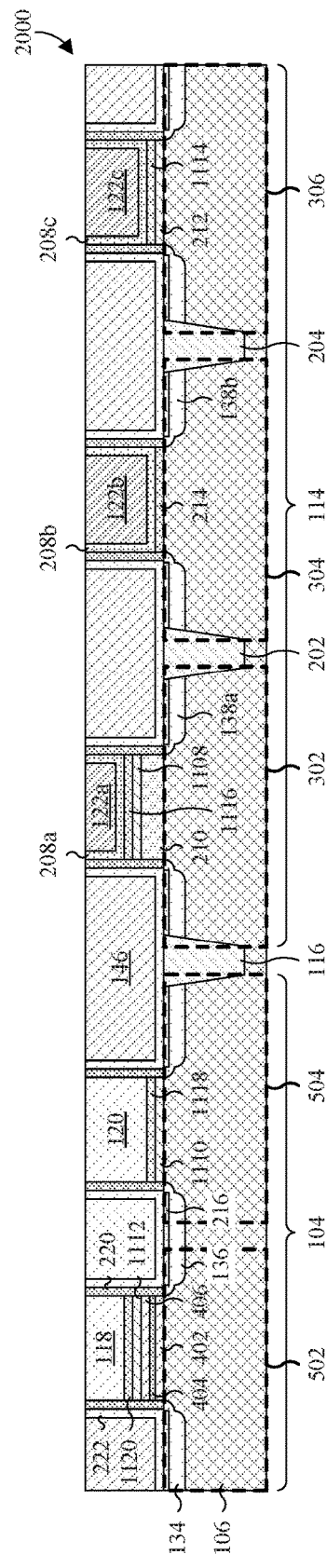
Fig. 19
Fig. 20

HIGH-K-LAST MANUFACTURING PROCESS FOR EMBEDDED MEMORY WITH SILICON-OXIDE-NITRIDE-OXIDE-SILICON (SONOS) MEMORY CELLS

BACKGROUND

Embedded memory is electronic memory that is integrated with logic devices on a common integrated circuit (IC) die or chip. The embedded memory supports operation of the logic devices and is often used with very-large-scale integration (VLSI) IC dies or chips. The integration advantageously improves performance by eliminating interconnect structures between chips and advantageously reduces manufacturing costs by sharing process steps between the embedded memory and the logic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-22 illustrate a series of cross-sectional views of some embodiments of a high-κ-last method for manufacturing an IC with an embedded SONOS memory cell.

DETAILED DESCRIPTION

Figure 1:
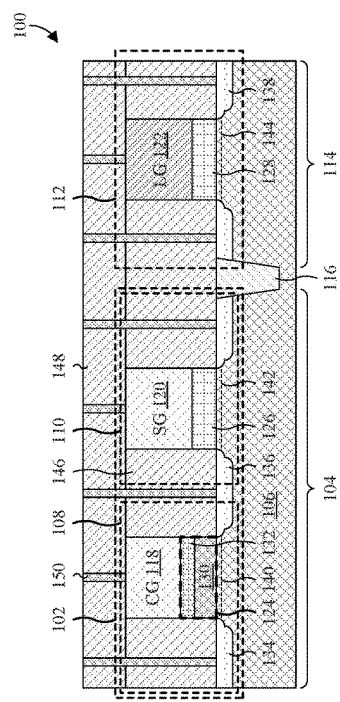
FIG. 1 illustrates a cross-sectional view of some embodiments of an integrated circuit (IC) using high-κ metal gate (HKMG) technology and comprising an embedded silicon-oxide-nitride-oxide-silicon (SONOS) memory cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated circuits (ICs) comprise logic devices and embedded memory. The logic devices comprise respective polysilicon logic gates arranged over and vertically spaced from a semiconductor substrate by respective logic dielectric regions. The embedded memory comprises an array of two transistor (2T) silicon-oxide-nitride-oxide-silicon (SONOS) memory cells. A 2T SONOS memory cell comprises a polysilicon control gate and a polysilicon select gate laterally spaced over the semiconductor substrate. The polysilicon control and select gates are arranged over and vertically spaced from the semiconductor substrate by respective control and select dielectric regions, and the control dielectric region comprises a charge trapping layer. Further, respective source/drain regions of the polysilicon control and select gates are laterally spaced on opposing sides of the polysilicon control and select gates with a source/drain region arranged laterally between the polysilicon control and select gates.

One challenge with the foregoing ICs is that the ICs are reaching performance and/or scaling limits due to the use of polysilicon gates. Performance may be quantified in terms of, for example, power consumption and/or switching speed.

The present application is directed towards an IC using high-κ metal gate (HKMG) technology with an embedded SONOS memory cell. In some embodiments, the IC comprises a logic device and an embedded memory cell arranged on a semiconductor substrate. The logic device comprises a dielectric layer with a dielectric constant κ greater than about 3.9 (i.e., a high κ layer), and further comprises a logic gate of metal arranged over the dielectric layer. The embedded memory cell comprises a control transistor and a select transistor. The control and select transistors respectively comprise a control gate and a select gate that are laterally adjacent to the one another and that are polysilicon. Further, the control transistor comprises a charge trapping layer over which the control gate is arranged. By incorporating HKMG technology into the logic device, the IC achieves good performance, low power consumption, and scaling. The metal gate and the high κ layer lower leakage current, increase maximum drain current, mitigate fermi-level pinning, and lower a threshold voltage for the logic device.

The present application is also directed towards a method for manufacturing the IC. In some embodiments, a control gate, a select gate, and a dummy gate are formed of polysilicon and laterally spaced over a semiconductor substrate. The dummy gate is subsequently removed to form a gate opening, and a high κ layer is formed in the gate opening. Further, a logic gate of metal is formed in the gate opening. By forming the high κ layer and the metal gate last, manufacturing costs are low and process length is short. Further, HKMG technology can be employed without changing a manufacturing process for an embedded memory cell comprising the control and select gates.

With reference to FIG. 1, a cross-sectional view 100 of some embodiments of an IC using HKMG technology with an embedded SONOS memory cell 102 is provided. As illustrated, the memory cell 102 is arranged on a memory region 104 of a semiconductor substrate 106, and comprises a control transistor 108 and a select transistor 110. Further, a logic device 112 is arranged on a logic region 114 of the semiconductor substrate 106. The memory region 104 and the logic region 114 are laterally adjacent to one another and, in some embodiments, spaced from one another by an isolation region 116.

Respective gates 118, 120, 122 of the memory cell 102 and the logic device 112 are arranged over and vertically spaced from the semiconductor substrate 106 by respective dielectric regions 124, 126, 128. In some embodiments, upper or top surfaces of the gates 118, 120, 122 are substantially coplanar. The gates 118, 120, 122 comprise a control gate (CG) 118 and a select gate (SG) 120 arranged laterally adjacent to one another and corresponding to the control and select transistors 108, 110. Further, the gates 118, 120, 122 comprise a logic gate (LG) 122 corresponding to the logic device 112. The control and select gates 118, 120 are a first material, and the logic gate 122 is a second material. In some embodiments, the first material is polysilicon, and the second material is metal.

The dielectric regions 124, 126, 128 comprise a control dielectric region 124, a select dielectric region 126, and a logic dielectric region 128 corresponding to the control, select, and logic gates 118, 120, 122. The control dielectric region 124 comprises a charge trapping layer 130 and, in some embodiments, an overlying dielectric subregion 132. Further, the logic dielectric region 128 comprises or otherwise is a high κ layer (i.e., a dielectric layer with a dielectric constant κ greater than about 3.9).

Advantageously, incorporating HKMG technology into the logic device 112, the IC achieves good performance, low power consumption, and small scale. The metal gate and the high κ layer lower leakage current, increase maximum drain current, mitigate fermi-level pinning, and lower a threshold voltage for the logic device 112.

Respective source/drain regions 134, 136, 138 of the gates 118, 120, 122 are arranged in an upper surface of the semiconductor substrate 106. The source/drain regions 134, 136, 138 are arranged on opposite sides of the gates 118, 120, 122 and define respective channel regions 140, 142, 144 of the gates 118, 120, 122 under the gates 118, 120, 122. In some embodiments, the control and select gates 118, 120 share a source/drain region 136 arranged laterally between the control and select gates 118, 120.

A first interlayer dielectric (ILD) layer 146 is arranged laterally between the control, select, and logic gates 118, 120, 122 and, in some embodiments, has an upper or top surface that is substantially coplanar with the upper or top surfaces of the control, select, and logic gates 118, 120, 122. A second ILD layer 148 is arranged over the first ILD layer 146 and, in some embodiments, has a lower or bottom surface that is substantially coplanar with the upper or top surfaces of the control, select, and logic gates 118, 120, 122. Contacts 150 extend vertically through the first and second ILD layers 146, 148 to one or more of the source/drain regions 134, 136, 138 and/or one or more of the control, select, and logic gates 118, 120, 122.

In operation, the charge trapping layer 130 stores charge and selectively toggles between different amounts of stored charge respectively representing a logic "0" and a logic "1". To read the amount of stored charge, in some embodiments, a bias voltage is applied to the control gate 118, such that a control channel region 140 underlying the control gate 118 selectively conducts depending upon the amount of stored charge. Depending upon whether the control channel region 140 conducts, the charge trapping layer 130 stores a logic "0" or a logic "1". Since the stored charge screens an electric field produced by the control gate 118, the threshold voltage to induce the control channel region 140 to conduct varies with the amount of stored charge. Therefore, the bias voltage is chosen between the threshold voltages at different amounts of stored charge. To add charge to the charge trapping layer 130, in some embodiments, the control and select gates 118, 120 are respectively biased with comparatively high and low voltages to promote hot carrier injection. To remove charge in the charge trapping layer 130, in some embodiments, the control gate 118 is biased with a high voltage of opposite polarity as charge stored in the charge trapping layer 130 to promote Fowler-Nordheim tunneling (FNT) of the charge out of the charge trapping layer 130.

While the IC was described with regard to an embedded 2T SONOS memory cell 102, it is to be appreciated that other types of embedded memory cells are amenable. For example, the IC may comprise an embedded memory cell with more or less transistors. As another example, the IC may comprise an embedded memory cell with control and select gates that are not a semiconductor material.

Figure 2:
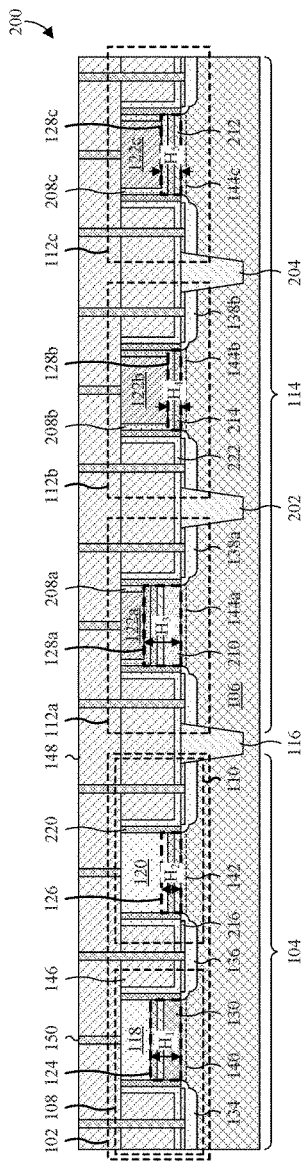
FIG. 2 illustrates a cross-sectional view of some more detailed embodiments of the IC of FIG. 1.

With reference to FIG. 2, a cross-sectional view 200 of some more detailed embodiments of the IC of FIG. 1. As illustrated, an embedded memory cell 102 is arranged on a memory region 104 of a semiconductor substrate 106, and a plurality of logic devices 112a, 112b, 112c is arranged on a logic region 114 of the semiconductor substrate 106. The embedded memory cell 102 may be, for example, a 2T SONOS memory cell, and/or may comprise, for example, a control transistor 108 and a select transistor 110. The semiconductor substrate 106 may be, for example, a bulk semiconductor substrate, such as a bulk silicon substrate, or a silicon-on-insulator (SOI) substrate. The logic devices 112a-112c may comprise, for example, a first logic device 112a, a second logic device 112b, a third logic device 112c, or a combination of the foregoing. The first logic device 112a may be, for example, a high voltage transistor, the second logic device 112b may be, for example, a single-gate-oxide transistor, and the third logic device 112c may be, for example, a dual-gate-oxide transistor.

The memory region 104 and the logic region 114 are laterally adjacent to one another and, in some embodiments, spaced from one another by a first isolation region 116. Further, in some embodiments, the logic devices 112a-112c are laterally spaced from one another by second isolation regions 202, 204. The first and/or second isolation regions 116, 202, 204 may be, for example, shallow trench isolation (STI) regions, deep trench isolation (DTI) regions, implant isolation regions, or a combination of the foregoing.

Respective gates 118, 120, 122a, 122b, 122c of the memory cell 102 and the logic devices 112a-112c are arranged over and vertically spaced from the semiconductor substrate 106 by respective dielectric regions 124, 126, 128a, 128b, 128c. In some embodiments, upper or top surfaces of the gates 118, 120, 122a-122c are substantially coplanar. Further, in some embodiments, heights of the gates 118, 120, 122a-122c vary. The gates 118, 120, 122a-122c comprise a control gate 118 and a select gate 120 arranged laterally adjacent to one another and both corresponding to the memory cell 102. Further, the gates 118, 120, 122a-122c comprise logic gates 122a-122c corresponding to the logic devices 112a-112c. The control and select gates 118, 120 are a first material, and the logic gates 122a-122c are a second material. In some embodiments, the first material is polysilicon or some other silicon, and/or the second material is metal. The metal may be or otherwise comprise, for example, titanium, tantalum, tungsten, copper, aluminum copper, or aluminum.

The dielectric regions 124, 126, 128a-128c are arranged between the gates 118, 120, 122a-122c and the semiconductor substrate 106 to insulate and space the gates 118, 120, 122a-122c from the semiconductor substrate 106. In some embodiments, the dielectric regions 124, 126, 128a-128c comprise substantially coplanar lower or bottom surfaces and/or have varying heights $H_1$, $H_2$, $H_3$, $H_4$, $H_5$. The dielectric regions 124, 126, 128a-128c comprise a control dielectric region 124, a select dielectric region 126, and logic dielectric regions 128a-128c corresponding to the control, select, and logic gates 118, 120, 122a-122c.

The logic dielectric regions 128a-128c comprise respective high κ layers 208a, 208b, 208c lining lower or bottom surfaces of the logic gates 122a-122c. In some embodiments, the high κ layers 208a-208c further line sidewall surfaces of the logic gates 122a-122c and/or directly abut the logic gates 122a-122c. The high κ layers 208a-206c may, for example, be or otherwise comprise hafnium oxide, hafnium silicon oxide, hafnium aluminum oxide, hafnium tantalum oxide, zirconium silicate, or zirconium oxide.

The control dielectric region 124 comprises a charge trapping layer 130 configured to store charge. In some embodiments, the charge trapping layer 130 is or otherwise comprises an oxide-nitride-oxide (ONO) structure or an oxide-nanocrystal-oxide (ONCO) structure. The ONO structure may comprise, for example, a first oxide layer, a nitride layer arranged over and abutting the first oxide layer, and a second oxide layer arranged over and abutting the nitride layer. The first and second oxide layers may be, for example, silicon dioxide, and/or the nitride layer may be, for example, silicon nitride. The ONCO structure may comprise, for example, the first oxide layer, a layer of nanocrystals arranged over and abutting the first oxide layer, and the second oxide layer arranged over and abutting the layer of nanocrystals. The layer of nanocrystals may be, for example, a layer of silicon dots.

In some embodiments, the dielectric regions 124, 126, 128a-128c respectively comprise dielectric layers 210, 212, 214 underlying the high κ layers 208a-208c and/or overlying the charge trapping layer 130. For example, a first logic dielectric region 128a may comprise a first dielectric layer 210. As another example, the control and select dielectric regions 124, 126 and first and third logic dielectric regions 128a, 128c may respectively comprise second dielectric layers 212. As yet another example, the control and select dielectric regions 124, 126 and first, second, and third logic dielectric regions 128a-128c may respectively comprise third dielectric layers 214. The first, second, and third dielectric layers 210, 212, 214 may be, for example, silicon dioxide, silicon nitride, or a combination of the foregoing.

Respective source/drain regions 134, 136, 138a, 138b of the gates 118, 120, 122a-122c are arranged in an upper surface the semiconductor substrate 106. The source/drain regions 134, 136, 138a, 138b are arranged on opposite sides of the gates 118, 120, 122a-122c and define respective channel regions 140, 142, 144a, 144b, 144c of the gates 118, 120, 122a-122c under the gates 118, 120, 122a-122c. The channel regions 140, 142, 144a-144c selectively conduct depending upon biases applied to the gates 118, 120, 122a-122c. In some embodiments, the control and select gates 118, 120 share a source/drain region 136 arranged laterally between the control and select gates 118, 120. The source/drain regions 134, 136, 138a, 138b may be, for example, doped regions having an opposite doping type (n- or p-type) as surrounding regions of the semiconductor substrate 106. Further, the source/drain regions 134, 136, 138a, 138b may be, for example, covered by silicide layers 216. In some embodiments, the silicide layers 216 are nickel silicide or titanium silicide.

In some embodiments, a main sidewall structure 220 and/or a contact etch stop layer (CESL) 222 line sidewalls of the gates 118, 120, 122a-122c. Further, in some embodiments, the CESL 222 extends laterally to cover the source/drain regions 134, 136, 138a, 138b, and/or to cover the first and/or second isolation regions 116, 202, 204. Even more, in some embodiments, the main sidewall structure 220 is arranged laterally between the CESL 222 and the gates 118, 120, 122a-122c, and/or is arranged laterally between the CESL 222 and the high κ layers 208a-208c. Moreover, in some embodiments, upper or top surfaces of the main sidewall structure 220 and/or CESL 222 are substantially coplanar with the upper or top surfaces of the gates 118, 120, 122a-122c. The main sidewall structure 220 and/or the CESL 222 may be, for example, silicon dioxide, silicon nitride, or some other dielectric.

A first ILD layer 146 is arranged laterally between the gates 118, 120, 122a-122c and, in some embodiments, has an upper or top surface that is substantially coplanar with the upper or top surfaces of the gates 118, 120, 122a-122c. A second ILD layer 148 is arranged over the first ILD layer 146 and, in some embodiments, has a lower or bottom surface that is substantially coplanar with the upper or top surfaces of the gates 118, 120, 122a-122c. The first and/or second ILD layers 146, 148 may be, for example, an oxide, polysilicate glass (PSG), a dielectric material with a dielectric constant less about 3.9 (i.e., a low κ dielectric material), or some other dielectric material. Contacts 150 extend vertically through the first and second ILD layers 146, 148 to one or more of the source/drain regions 134, 136, 138a, 138b and/or one or more of the gates 118, 120, 122a-122c. The contacts 150 may be, for example, tungsten, copper, aluminum copper, or some other conductive material.

While the IC of FIG. 2 is illustrated with multiple logic devices 112a-112c, more or less logic devices are amenable. For example, the IC of FIG. 2 may omit the first and third logic devices 112a, 112c. As another example, the IC of FIG. 2 may omit the first and second logic devices 112a, 112b. As yet another example, the IC of FIG. 2 may omit the second and third logic devices 112b, 112c.

With reference to FIGS. 3-22, a series of cross-sectional views of some embodiments of a high-κ-last method for manufacturing an IC with an embedded SONOS memory cell is provided.

As illustrated by the cross-sectional view 300 of FIG. 3, a first isolation region 116 is formed on an upper side of a semiconductor substrate 106 to laterally space a memory region 104 of the semiconductor substrate 106 from a logic region 114 of the semiconductor substrate 106. Further, one or more second isolation regions 202, 204 are formed on the upper side of the semiconductor substrate 106 to divide the logic region 114 into logic device regions 302, 304, 306. The logic device regions 302, 304, 306 may, for example, correspond to different device types, such as high voltage transistors and dual-gate-oxide transistors. In some embodiments, the first and second isolation regions 116, 202, 204 are formed concurrently. Further, in some embodiments, the process for forming the first and/or second isolation regions 116, 202, 204 comprises etching into the semiconductor substrate 106 to form trenches and subsequently filling the trenches with a dielectric material.

As illustrated by the cross-sectional view 400 of FIG. 4, a charge trapping layer 130 is formed covering the semiconductor substrate 106 and the first and second isolation regions 116, 202, 204. In some embodiments, the charge trapping layer 130 comprises a first oxide layer 402, a nitride or nanocrystal layer 404 arranged over the first oxide layer 402, and a second oxide layer 406 arranged over the nitride or nanocrystal layer 404. The first and second oxide layers 402, 406 may be, for example, silicon dioxide, and/or the nitride or nanocrystal layer 404 may be, for example, silicon nitride or silicon nanocrystals. Further, in some embodiments, the nitride or nanocrystal layer 404 is arranged directly on the first oxide layer 402, and/or the second oxide layer 406 is arranged directly on the nitride or nanocrystal layer 404. The process for forming the charge trapping layer 130 may, for example, comprise sequentially forming the first oxide layer 402, the nitride or nanocrystal layer 404, and the second oxide layer 406. The first and second oxide layers 402, 406 and the nitride or nanocrystal layer 404 may be formed by, for example, thermal oxidation, chemical vapor deposition (CVD), physical vapor deposition (PVD), atomic layer deposition (ALD), or a combination of the foregoing.

As illustrated by the cross-sectional view 500 of FIG. 5, a first etch is performed into the charge trapping layer 130. The first etch localizes the charge trapping layer 130 to a control transistor region 502 of the memory region 104 that is laterally adjacent to a select transistor region 504 of the memory region 104. The process for performing the first etch may, for example, comprise depositing and patterning a first photoresist layer 506 over the charge trapping layer 130 so as to mask a region of the charge trapping layer 130 localized to the control transistor region 502. Further, the process may, for example, comprise applying one or more etchants 508 to the charge trapping layer 130 while using the first photoresist layer 506 as a mask. Even more, the process may comprise, for example, subsequently removing or otherwise stripping the first photoresist layer 506.

As illustrated by the cross-sectional view 600 of FIG. 6, a first dielectric layer 210 is formed covering the charge trapping layer 130 and exposed regions of the semiconductor substrate 106. The first dielectric layer 210 may be, for example, silicon dioxide or some other oxide. Further, the first dielectric layer 210 may be formed by, for example, one or more of thermal oxidation, CVD, PVD, or ALD. In some embodiments, the first dielectric layer 210 is formed conformally (e.g., with a substantially uniform thickness).

As illustrated by the cross-sectional view 700 of FIG. 7, a second etch is performed into the first dielectric layer 210 to localize the first dielectric layer 210 to first and second logic device regions 302, 304. The process for performing the second etch may, for example, comprise depositing and patterning a second photoresist layer 702 over the first dielectric layer 210 so as to mask a region of the first dielectric layer 210 localized to the first and second logic device regions 302, 304. Further, the process may comprise, for example, applying one or more etchants 704 to the first dielectric layer 210 while using the second photoresist layer 702 as a mask. Even more, the process may comprise, for example, subsequently removing or otherwise stripping the second photoresist layer 702.

As illustrated by the cross-sectional view 800 of FIG. 8, a second dielectric layer 802 is formed lining the charge trapping layer 130, the first dielectric layer 210, and exposed regions of the semiconductor substrate 106. The second dielectric layer 802 may be, for example, silicon dioxide or some other oxide. Further, the second dielectric layer 802 may be formed by, for example, one or more of thermal oxidation, CVD, PVD, or ALD. In some embodiments, the second dielectric layer 802 is formed conformally.

Figure 9:
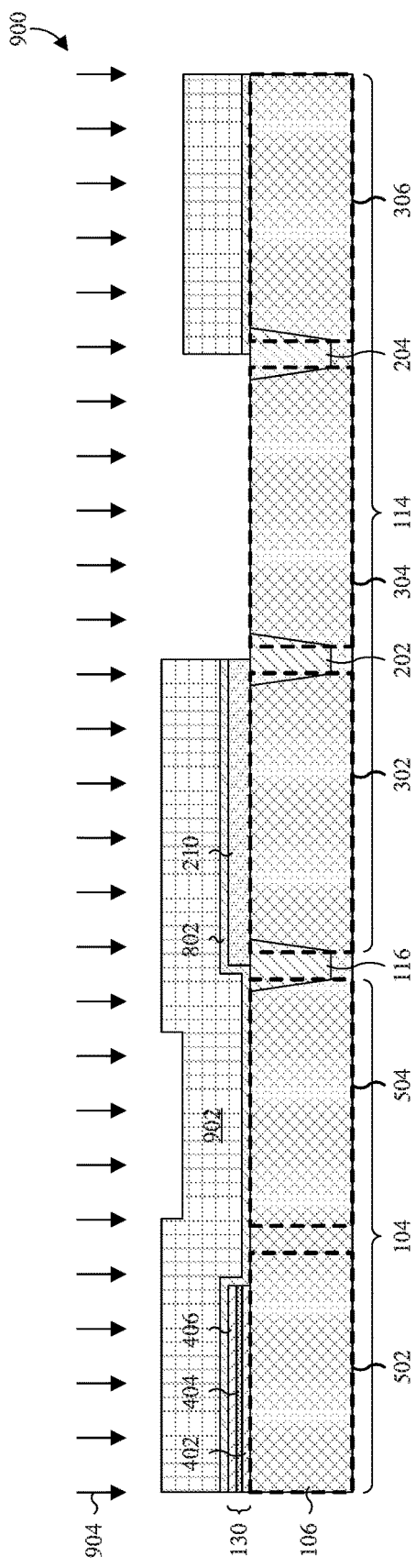

As illustrated by the cross-sectional view 900 of FIG. 9, a third etch is performed into the first and second dielectric layers 210, 802 to expose a second logic device region 304 between first and third logic device regions 302, 306. The process for performing the third etch may comprise, for example, depositing and patterning a third photoresist layer 902 over regions of the second dielectric layer 802 laterally surrounding the second logic device region 304. Further, the process may comprise, for example, applying one or more etchants 904 to the first and second dielectric layers 210, 802 while using the third photoresist layer 902 as a mask. Even more, the process may comprise, for example, subsequently removing or otherwise stripping the third photoresist layer 902.

Figure 10:
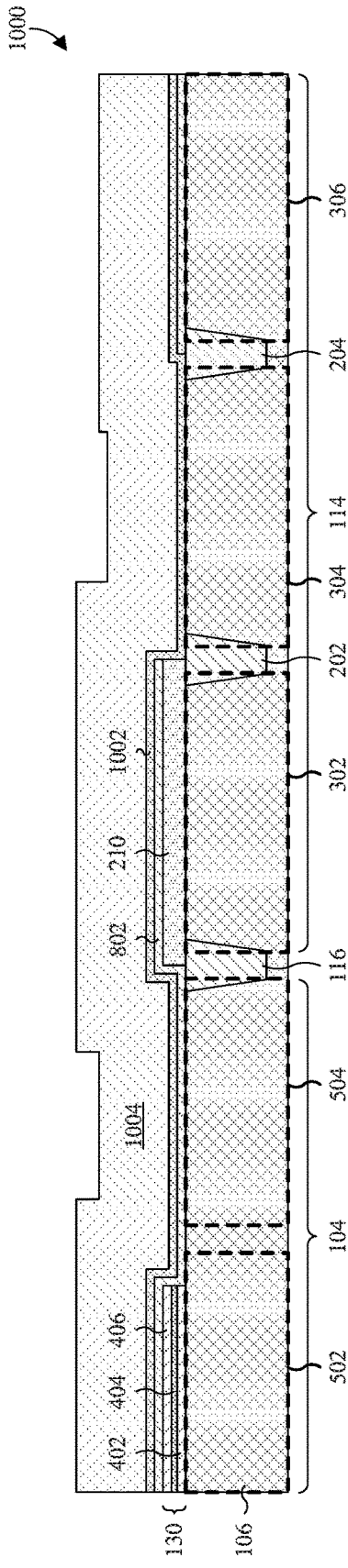

As illustrated by the cross-sectional view 1000 of FIG. 10, a third dielectric layer 1002 is formed lining the second dielectric layer 802 and the second logic device region 304. The third dielectric layer 1002 may be, for example, silicon dioxide. Further, the third dielectric layer 1002 may be formed by, for example, one or more of thermal oxidation, CVD, PVD, or ALD. In some embodiments, the third dielectric layer 1002 is formed conformally.

Also illustrated by the cross-sectional view 1000 of FIG. 10, a first conductive layer 1004 is formed lining the third dielectric layer 1002. The first conductive layer 1004 may be, for example, polysilicon (e.g., doped polysilicon) or some other conductive material. Further, the first conductive layer 1004 may be formed by, for example, one or more of CVD, PVD, or ALD. In some embodiments, the first conductive layer 1004 is formed conformally.

Figures 11, 12:
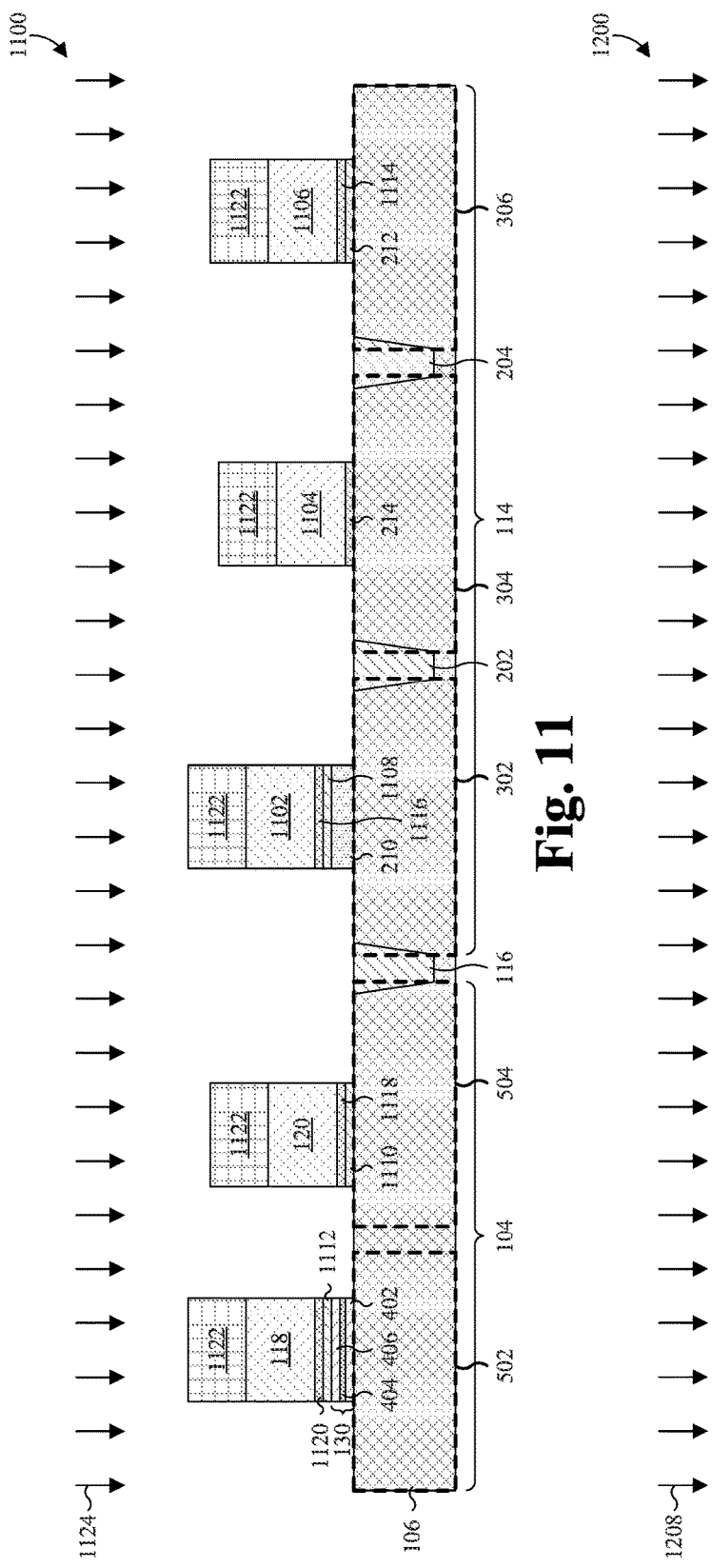

As illustrated by the cross-sectional view 1100 of FIG. 11, a fourth etch is performed into the charge trapping layer 130, the first conductive layer 1004 (see, e.g., FIG. 10), and the first, second, and third dielectric layers 210, 802, 1002 (see, e.g., FIG. 10). The fourth etch forms a control gate 118 and a select gate 120 respectively over the control and select transistor regions 502, 504, as well as first, second, and third dummy gates 1102, 1104, 1106 respectively over the first, second, and third logic device regions 302, 304, 306. Further, the fourth etch localizes the charge trapping layer 130 to under the control gate 118 and localizes the first dielectric layer 210 to under the first dummy gate 1102. Even more, the fourth etch divides the second dielectric layer 802 into multiple second dielectric layers 212, 1108, 1110, 1112 individual to and under the third and first dummy gates 1106, 1102 and the select and control gates 120, 118. Moreover, the fourth etch divides the third dielectric layer 1002 into multiple third dielectric layers 214, 1114, 1116, 1118, 1120 individual to and under the second, third, and first dummy gates 1104, 1106, 1102 and the select and control gates 120, 118.

The process for performing the fourth etch may comprise, for example, depositing and patterning a fourth photoresist layer 1122 over regions of the first conductive layer 1004 corresponding to the control, select, and dummy gates 118, 120, 1102-1106. Further, the process may comprise, for example, applying one or more etchants 1124 to the charge trapping layer 130, the first conductive layer 1004, and the first, second, and third dielectric layers 210, 802, 1002 while using the fourth photoresist layer 1122 as a mask. Even more, the process may comprise subsequently removing or otherwise stripping the fourth photoresist layer 1124.

As illustrated by the cross-sectional view 1200 of FIG. 12, lightly-doped drain (LDD) regions 1202, 1204, 1206 are formed in exposed regions of the semiconductor substrate 106. In some embodiments, the LDD regions 1202, 1204, 1206 are formed by implanting ions 1208 into the semiconductor substrate 106 by, for example, ion implantation.

Figure 13:
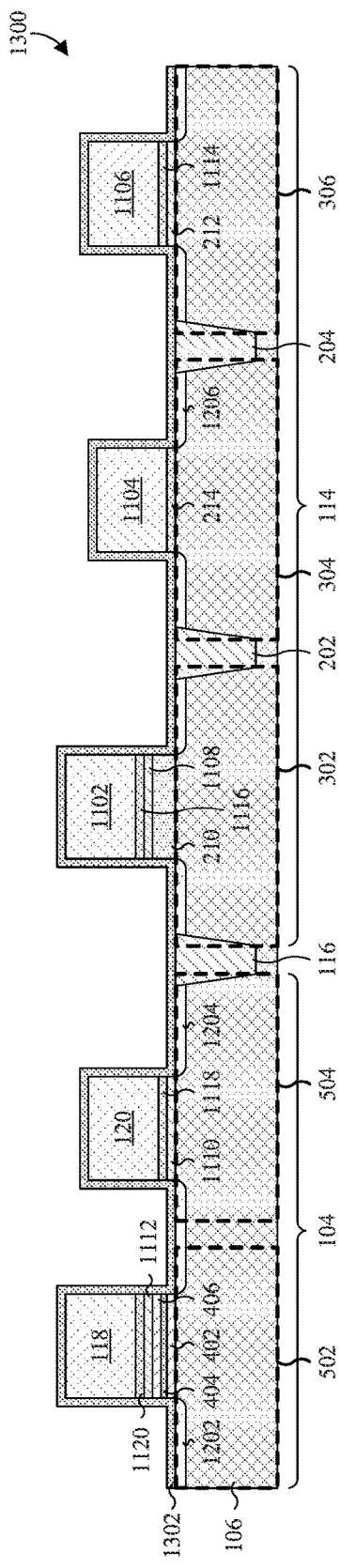

As illustrated by the cross-sectional view 1300 of FIG. 13, a sidewall layer 1302 is formed lining: the first, second, and third dummy gates 1102, 1104, 1106; the control and select 118, 120; and the LDD regions 1202, 1204, 1206. The sidewall layer 1302 may be, for example, silicon dioxide, silicon nitride, or some other dielectric. Further, the sidewall layer 1302 may be formed by, for example, one or more of thermal oxidation, CVD, PVD, or ALD. In some embodiments, the sidewall layer 1302 is formed conformally.

Figure 14:
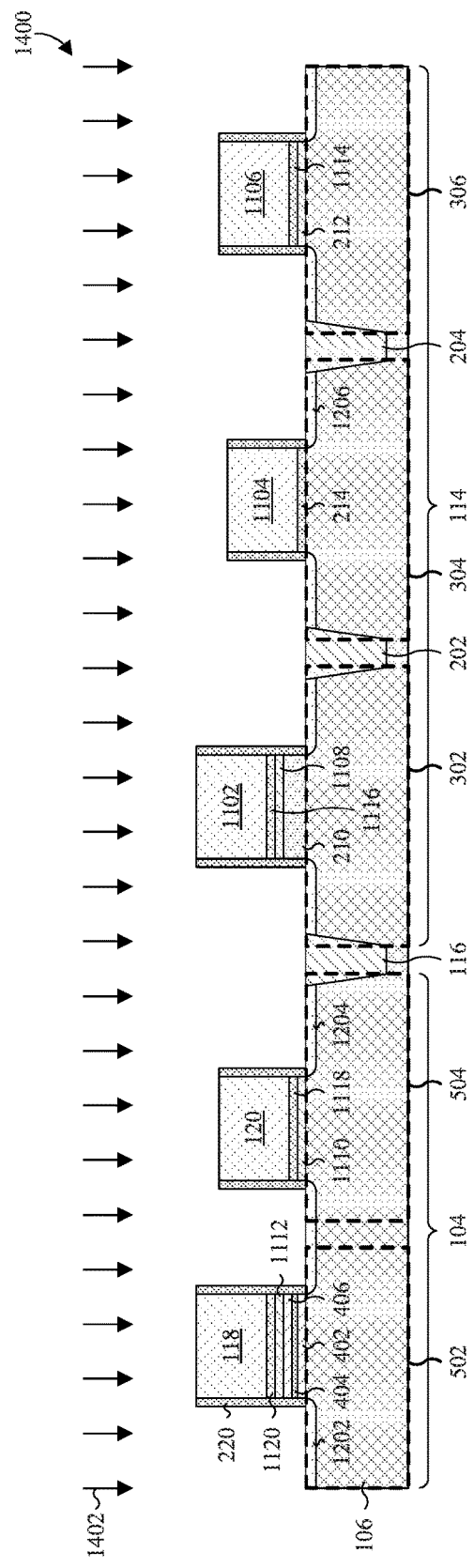

As illustrated by the cross-sectional view 1400 of FIG. 14, the sidewall layer 1302 is etched back to form a main sidewall structure 220 lining sidewalls of the first, second, and third dummy gates 1102, 1104, 1106 and the control and select 118, 120. In some embodiments, the main sidewall structure 220 is confined to sidewalls (i.e., is devoid of lateral extensions). The process for performing the etch back may comprise, for example, applying one or more etchants 1402 to the sidewall layer 1302 for the approximate time it takes the etchant(s) 1402 to etch through a thickness of the sidewall layer 1302.

As illustrated by the cross-sectional view 1500 of FIG. 15, source/drain regions 134, 136, 138a, 138b, which include the LDD regions 1202, 1204, 1206 (see, e.g., FIG. 14), are formed. In some embodiments, the source/drain regions 134, 136, 138a, 138b are formed by implanting ions 1502 into the semiconductor substrate 106 by, for example, ion implantation.

As illustrated by the cross-sectional view 1600 of FIG. 16, in some embodiments, silicide layers 216 are formed on the source/drain regions 134, 136, 138a, 138b. The process for forming the silicide layers 216 may comprise, for example, a nickel silidation process. Further, the process for forming the silicide layers 216 may comprise, for example, forming a resist protect oxide (RPO) layer covering surfaces surrounding the source/drain regions 134, 136, 138a, 138b to block silicide from forming on these surfaces.

Also illustrated by the cross-sectional view 1600 of FIG. 16, a CESL 222 is formed lining: the main sidewall structure 220; upper or top surfaces of the first, second, and third dummy gates 1102, 1104, 1106 and of the control and select gates 118, 120; and the source/drain regions 134, 136, 138a, 138b. The CESL 222 may be, for example, silicon dioxide, silicon nitride, or some other dielectric. Further, the CESL 222 may be formed by, for example, one or more of thermal oxidation, CVD, PVD, or ALD. In some embodiments, the CESL 222 is formed conformally.

Also illustrated by the cross-sectional view 1600 of FIG. 16, a first ILD layer 146 is formed covering the CESL 222. The first ILD layer 146 may be, for example, an oxide, PSG, a low κ dielectric, or some other dielectric. Further, the first ILD layer 146 may be formed by, for example, one or more of CVD or PVD.

Figure 17:
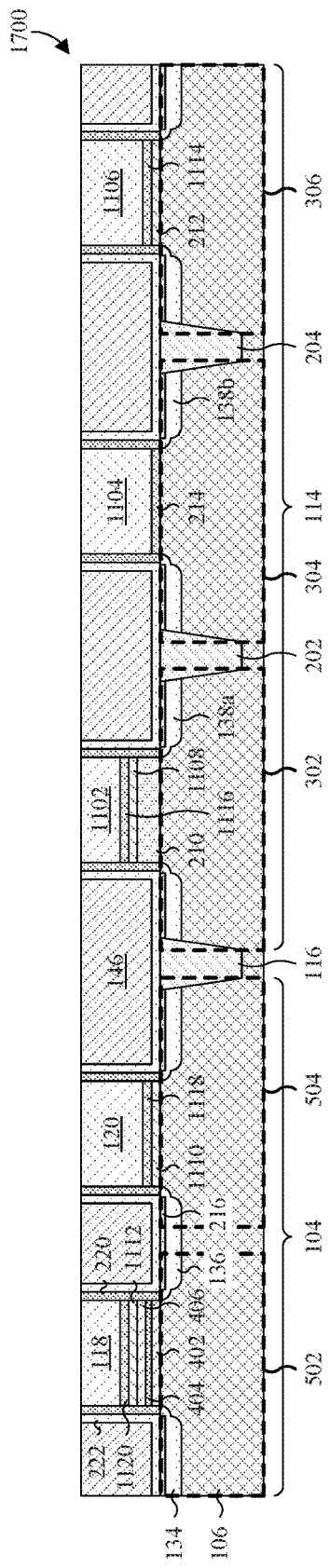

As illustrated by the cross-sectional view 1700 of FIG. 17, a first planarization is performed into the first ILD layer 146, the main sidewall structure 220, and the CESL 222 to expose the upper or top surfaces of the first, second, and third dummy gates 1102, 1104, 1106 and of the control and select gates 118, 120. The first planarization may be performed by, for example, a chemical mechanical polish (CMP) and/or an etch back.

Figure 18:
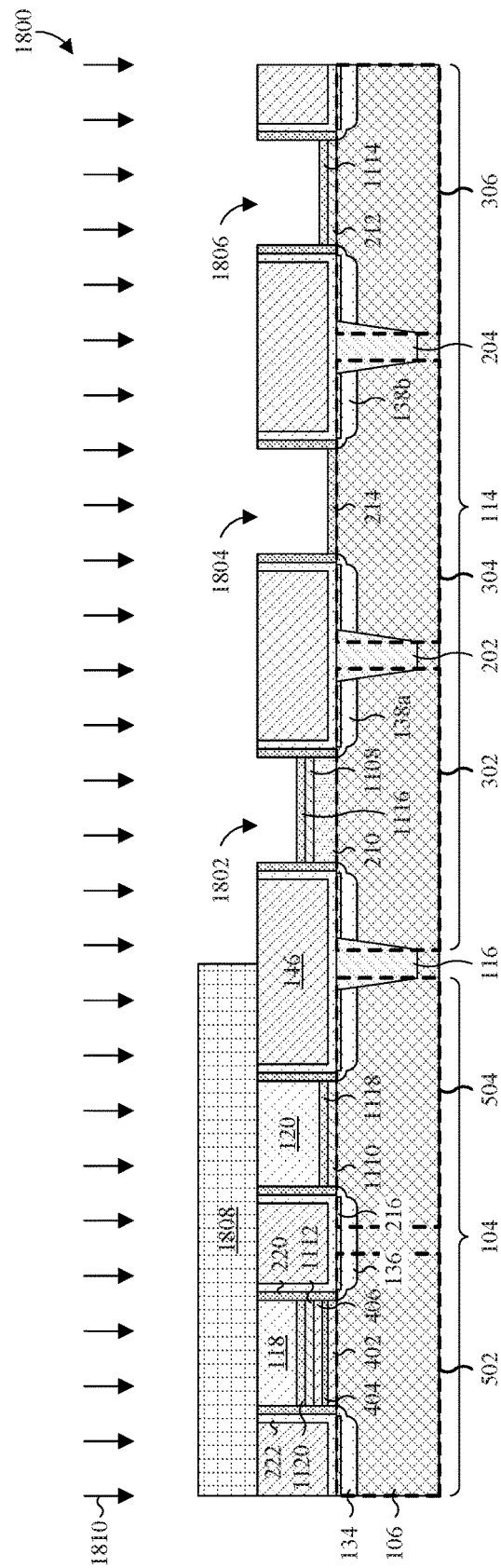

As illustrated by the cross-sectional view 1800 of FIG. 18, a fifth etch is performed into the first, second, and third dummy gates 1102, 1104, 1106 (see, e.g., FIG. 17) to remove the dummy gates 1102, 1104, 1106 and to form respective gate openings 1802, 1804, 1806. The process for performing the fifth etch may comprise, for example, depositing and patterning a fifth photoresist layer 1808 covering the control and select gates 118, 120. Further, the process may comprise, for example, applying one or more etchants 1810 to the first, second, and third dummy gates 1102, 1104, 1106 while using the fifth photoresist layer 1808 as a mask. Further, the process may comprise, for example, subsequently removing or otherwise stripping the fifth photoresist layer 1808.

As illustrated by the cross-sectional view 1900 of FIG. 19, a high κ layer 1902 is formed lining the gate openings 1802, 1804, 1806 (see, e.g., FIG. 18) previously occupied by the first, second, and third dummy gates 1102, 1104, 1106 (see, e.g., FIG. 17). The high κ layer 1902 has a dielectric constant κ exceeding about 3.9 and may be, for example, hafnium oxide. Further, the high κ layer 1902 may be formed by, for example, CVD, PVD, ALD, or a combination of the foregoing. In some embodiments, the high κ layer 1902 is formed conformally.

Also illustrated by the cross-sectional view 1900 of FIG. 19, a second conductive layer 1904 is formed covering the high κ layer 1902 and in the gate openings 1802, 1804, 1806 (see, e.g., FIG. 18). The second conductive layer 1904 is a different material than the first conductive layer 1004 (see, e.g., FIG. 10) and may be, for example, copper, tungsten, aluminum, or some other metal. Further, the second conductive layer 1904 may be formed by, for example, CVD, PVD, ALD, or a combination of the foregoing.

As illustrated by the cross-sectional view 2000 of FIG. 2000, a second planarization is performed into the second conductive layer 1904 (see, e.g., FIG. 19) and the high κ layer 1902 (see, e.g., FIG. 19) to about even with upper or top surfaces of the control and select gates 118, 120. The second planarization forms logic gates 122a, 122b, 122c in the gate openings 1802, 1804, 1806 (see, e.g., FIG. 18). Further, the second planarization divides the high κ layer 1902 into multiple high κ layer 208a, 208b, 208c individual to and under the logic gates 122a, 122b, 122c. Even more, in some embodiments, the second planarization coplanarizes upper or top surfaces of the logic gates 122a-122c with upper or top surfaces of the first ILD layer 146 and the control and the select gate 118, 120. The second planarization may be performed by, for example, a CMP and/or etch back.

Figure 21:
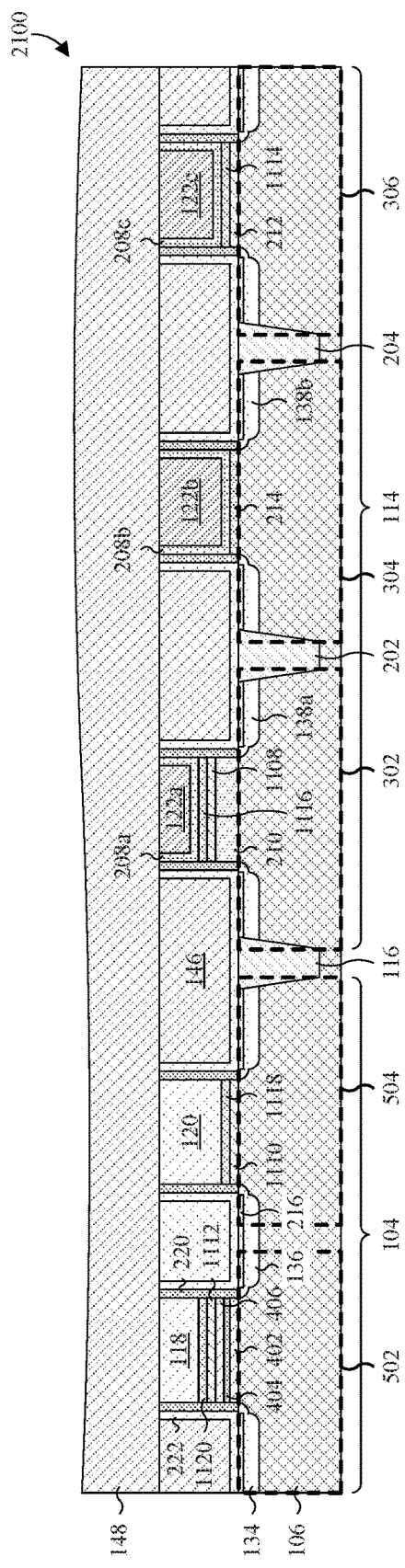

As illustrated by the cross-sectional view 2100 of FIG. 21, a second ILD layer 148 is formed covering the first ILD layer 146, as well as the control and select gates 118, 120 and the logic gates 122a-122c. The second ILD layer 148 may be, for example, an oxide, PSG, or a low κ dielectric. Further, the second ILD layer 148 may be formed by, for example, CVD or PVD.

Figure 22:
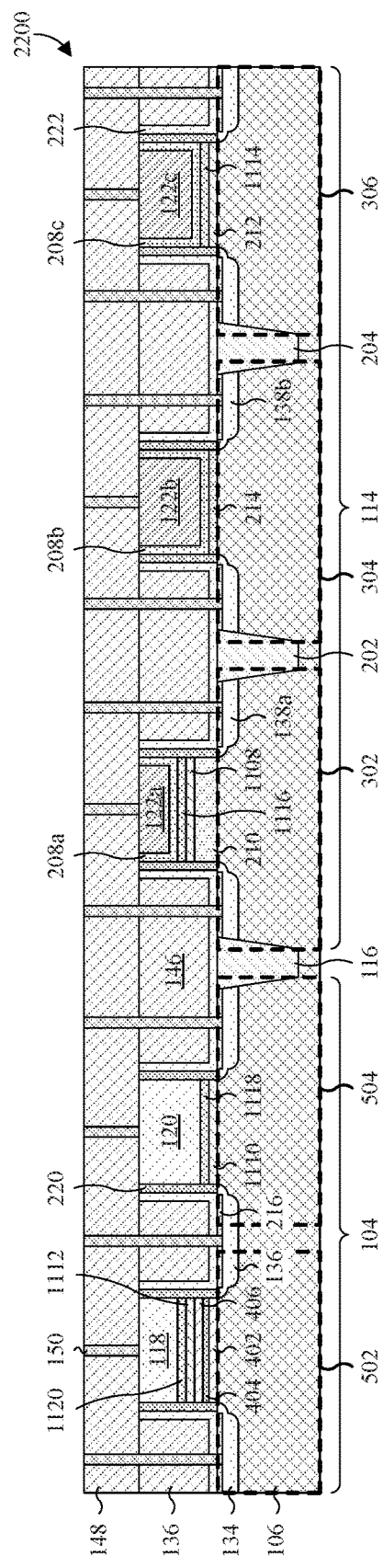

As illustrated by the cross-sectional view 2200 of FIG. 22, a third planarization is performed into the second ILD layer 148. The third planarization may be performed by, for example, a CMP and/or an etch back.

Also illustrated by the cross-sectional view 2200 of FIG. 22, contacts 150 are formed extending through the first and second ILD layers 146, 148 to the source/drain regions 134, 136, 138a, 138b. Additionally, or alternatively, the contacts 150 are formed extending to the control, select, and logic gates 118, 120, 122a-122c. The contacts 150 may be formed of, for example, tungsten, copper, aluminum copper, or some other conductive material. Further, the process for forming the contacts 150 may comprise, for example, performing a sixth etch into the first and second ILD layers 146, 148 to form contact openings, filling the contact openings with a third conductive layer, and planarizing the third conductive layer to coplanarize upper surfaces of the second ILD layer 148 and the third conductive layer.

Figure 23:
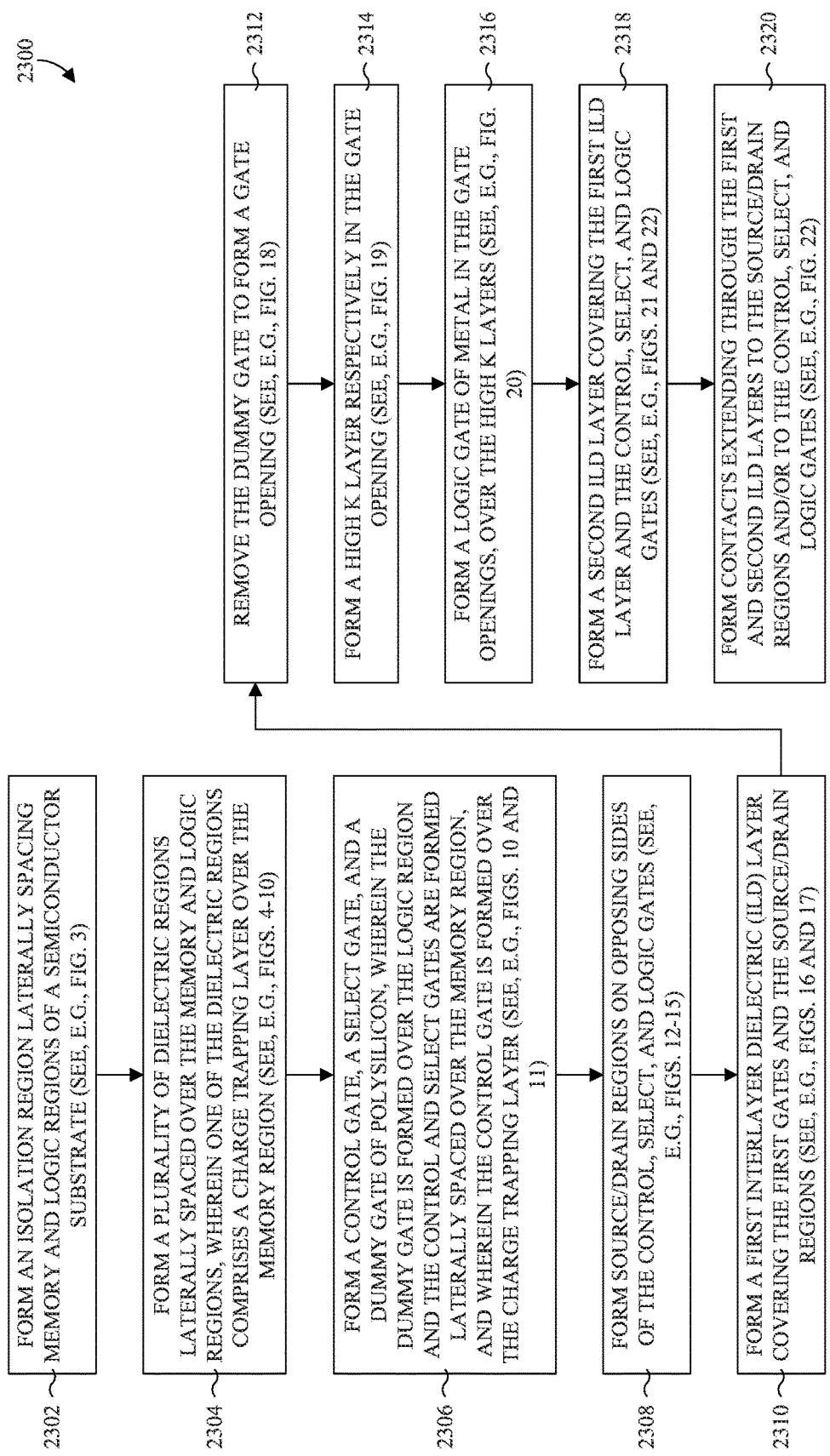
FIG. 23 illustrates a flowchart of some embodiments of the high-κ-last method of FIGS. 3-22.

With reference to FIG. 23, a flowchart 2300 of some embodiments of a high-κ-last method for manufacturing an IC with an embedded SONOS memory cell is provided. The high-κ-last method may, for example, to the series of cross-sectional views illustrated with regard to FIGS. 3-22.

At 2302, an isolation region is formed laterally spacing memory and logic regions of a semiconductor substrate. See, for example, FIG. 3.

At 2304, a plurality of dielectric regions is formed laterally spaced over the memory and logic regions. Further, the plurality of dielectric regions is formed with a dielectric region comprising a charge trapping layer over the memory region. In some embodiments, the dielectric regions of the plurality are formed with varying thicknesses. See, for example, FIGS. 4-10.

At 2306, a control gate, a select gate, and a dummy gate are formed of polysilicon respectively over the dielectric regions. The dummy gate is formed over the logic region, and the control and select gates are formed laterally spaced over the memory region. Further, the control gate is formed over the charge trapping layer. See, for example, FIGS. 10 and 11.

At 2308, source/drain regions are formed on opposing sides of the control, select, and dummy gates. See, for example, FIGS. 12-15.

At 2310, a first ILD layer is formed covering the control, select, and dummy gates and the source/drain regions. See, for example, FIGS. 16 and 17.

At 2312, the dummy gate is removed to form a gate opening. See, for example, FIG. 18.

At 2314, a high κ layer is formed in the gate opening. The high κ layer has a dielectric constant κ exceeding about 3.9. See, for example, FIG. 19.

At 2316, a logic gate is formed of metal and in the gate opening, over the high κ layer. See, for example, FIG. 20.

At 2318, a second ILD layer is formed covering the first ILD layer and the control, select, and logic gates. See, for example, FIGS. 21 and 22.

At 2320, contacts are formed extending through the first and second ILD layers to the source/drain regions and/or to the control, select, and logic gates. See, for example, FIG. 22.

By forming the high κ layer and the metal gate last (e.g., after forming the source/drain regions), manufacturing costs are low and process length is short. Further, by using HKMG technology, the IC achieves good performance, low power consumption, and scaling.

While the method is described as using control, select, and dummy gates of polysilicon and a logic gate of metal, different gate materials may be employed. Moreover, while the method is described as using a high κ layer, the high κ layer may be omitted or replaced with a different material. Even more, while the method described by the flowchart 2300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides an IC comprising a logic device and a memory cell. The logic device is arranged on a semiconductor substrate and comprises a logic gate arranged within a high κ dielectric layer. The memory cell is arranged on the semiconductor substrate and comprises a control transistor and a select transistor laterally adjacent to one another. The control and select transistors respectively comprise a control gate and a select gate, and the control transistor further comprises a charge trapping layer underlying the control gate. The control and select gates are a first material, and the logic gate is a second material.

In other embodiments, the present disclosure provides a high-κ-last method for manufacturing an integrated circuit. A charge trapping layer is formed over a semiconductor substrate. A control gate, a select gate, and a dummy gate are formed of a first material and laterally spaced over the semiconductor substrate. The control gate is formed over the charge trapping layer. An ILD layer is formed laterally between the control, select, and dummy gates and with an upper surface substantially coplanar with upper surfaces of the control, select, and dummy gates. The dummy gate is removed to form a gate opening. A high κ dielectric layer is formed lining the gate opening. A logic gate of a second material is formed in the gate opening and over the high κ dielectric layer.

In yet other embodiments, the present disclosure provides an IC comprising a logic device and a memory cell. The logic device is arranged on a semiconductor substrate and comprises a logic gate. The memory cell is arranged on the semiconductor substrate and comprises a control transistor and a select transistor laterally adjacent to one another. The control and select transistors respectively comprise a control gate and a select gate, and the control transistor further comprises a charge trapping layer underlying the control gate. The control and select gates are a first material, and the logic gate is a second material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit, the method comprising:
    forming a charge trapping layer over a semiconductor substrate;
    forming a conductive layer covering the charge trapping layer and the semiconductor substrate;
    forming a patterned photoresist layer over and contacting the conductive layer;
    forming a control gate, a select gate, and a dummy gate of a first material and laterally spaced over the semiconductor substrate, wherein the control gate is formed over the charge trapping layer;
    applying an etchant to the conductive layer with the patterned photoresist layer in place to concurrently form the control gate, the select gate, and the dummy gate from the conductive layer;
    forming an interlayer dielectric (ILD) layer laterally between the control gate and the select gate, and between the select gate and the dummy gate, wherein the ILD layer is formed with an upper surface substantially coplanar with upper surfaces of the control, select, and dummy gates, and wherein the ILD layer is formed after the control gate, the select gate, and the dummy gate are all formed;
    removing the dummy gate to form a gate opening;

forming a high κ dielectric layer lining the gate opening; and forming a logic gate of a second material in the gate opening and over the high κ dielectric layer.

2. The method according to claim 1, further comprising:
removing the dummy gate, but not the control and select gates.

3. The method according to claim 1, wherein the removing comprises:
performing an etch into the dummy gate to form the gate opening.

4. The method according to claim 1, wherein forming the logic gate comprises:
forming a second conductive layer of the second material filling the gate opening over the high κ dielectric layer; and
performing a planarization into the second conductive layer to form the logic gate.

5. The method according to claim 1, wherein the first material is polysilicon and the second material is metal.

6. The method according to claim 1, further comprising:
forming a first source/drain region laterally between the control and select gates after the control and select gates have both been formed; and
forming second and third source/drain regions corresponding to the control and select gates, and arranged on opposite sides of the corresponding control and select gates as the first source/drain region to define channel regions with the first source/drain region.

7. The method according to claim 1, further comprising:
forming a plurality of dielectric regions laterally spaced over the semiconductor substrate and with heights varying between the dielectric regions; and
forming the control, select, and logic gates respectively over the dielectric regions.

8. The method according to claim 1, wherein the semiconductor substrate comprises a logic region and a memory region, wherein the memory region comprises a select gate region and a control gate region adjacent the select gate region, and wherein the method further comprises:
forming a first dielectric layer and a second dielectric layer over the semiconductor substrate, wherein the first dielectric layer and the second dielectric layer each cover the charge trapping layer, the memory region, and the logic region;
patterning the first dielectric layer so it remains within a first area of the logic region and so it is removed from remaining areas of the logic region and the memory region; and
patterning the second dielectric layer so it is removed from a second area of the logic region and so it remains within remaining areas of the logic region and the memory region;
wherein the charge trapping layer and the control gate are formed within the control gate region, wherein the select gate is formed within the select gate region, and wherein the logic gate is formed in the logic region.

9. A method for manufacturing an integrated circuit (IC), the method comprising:
forming a charge trapping layer over a semiconductor substrate;
forming a conductive layer that is a first material and that covers the charge trapping layer and the semiconductor substrate;
forming a patterned photoresist layer over and contacting the conductive layer;

performing a single etch into the conductive layer to simultaneously form a control gate electrode, a select gate electrode, and a dummy gate electrode all from the conductive layer, wherein the control gate electrode, the select gate electrode, and the dummy gate electrode comprise the first material and are laterally spaced over the semiconductor substrate, wherein the control gate electrode is formed directly over the charge trapping layer, wherein the select gate electrode and the dummy gate electrode are formed laterally spaced from the charge trapping layer, and wherein the performing of the single etch comprises applying an etchant to the conductive layer with the patterned photoresist layer in place to concurrently form the control gate electrode, the select gate electrode, and the dummy gate electrode from the conductive layer; and
replacing the dummy gate electrode with a logic gate electrode of a second material different than the first material.

10. The method according to claim 9, wherein the control, select, and the dummy gate electrodes are formed respectively with bottom surfaces that are uneven, and respectively with top surfaces that are even.

11. The method according to claim 9, wherein forming the charge trapping layer comprises:
forming the charge trapping layer as multi-layer oxide-nitride-oxide (ONO) film covering the semiconductor substrate; and
performing an etch into the charge trapping layer to localize the charge trapping layer to a control region of the semiconductor substrate.

12. The method according to claim 9, further comprising:
forming a dielectric layer laterally between the control gate electrode and the select gate electrode, and laterally between the select gate electrode and the dummy gate electrode, wherein the dielectric layer is further formed with a top surface that is coplanar with top surfaces respectively of the control, select, and dummy gate electrodes.

13. The method according to claim 12, wherein the replacing comprises:
performing an etch into the dummy gate electrode, but not the select and control gate electrodes, to remove the dummy gate electrode, and to form a gate opening in place of the dummy gate electrode;
forming a second conductive layer of the second material covering the dielectric layer and filling the gate opening; and
performing a planarization into the second conductive layer to coplanarize a top surface of the second conductive layer with the top surface of the dielectric layer, and to define the logic gate electrode in the gate opening.

14. The method according to claim 12, further comprising:
forming an additional dielectric layer over the dielectric layer and the logic gate electrode;
performing a planarization into a top surface of the additional dielectric layer; and
forming contact vias extending through the additional dielectric layer to the logic gate electrode.

15. A method for manufacturing an integrated circuit (IC), the method comprising:
forming a charge trapping layer over a semiconductor substrate;

forming a first conductive layer of a first material covering the charge trapping layer and the semiconductor substrate;

performing a first etch into the first conductive layer to form a control gate electrode, a select gate electrode, and a dummy gate electrode laterally spaced over the semiconductor substrate, wherein the control gate electrode is formed partially covering the charge trapping layer, and wherein the first etch continues into the charge trapping layer after forming the control gate electrode so as to remove portions of the charge trapping layer uncovered by the control gate electrode and so the control gate electrode completely covers the charge trapping layer;

forming a dielectric layer laterally between the control and select gate electrodes, and laterally between the select and dummy gate electrodes, wherein the dielectric layer is further formed covering the control, select, and dummy gate electrodes, and wherein the dielectric layer is formed after the control gate electrode, the select gate electrode, and the dummy gate electrode are all formed;

performing a first planarization into the dielectric layer and the control, select, and dummy gate electrodes to coplanarize top surfaces respectively of the control, select, and dummy gate electrodes with a top surface of the dielectric layer;

performing a second etch into the dummy gate electrode to remove the dummy gate electrode, and to form a gate opening respectively in place of the dummy gate electrode;

forming a second conductive layer of a second material covering the dielectric layer and filling the gate opening; and performing a second planarization into the second conductive layer to coplanarize a top surface of the second conductive layer with the top surface of the dielectric layer, and to define a logic gate electrode in the gate opening.

16. The method according to claim 15, wherein the select and dummy gate electrodes are formed laterally spaced from the charge trapping layer, and wherein the control, select, and dummy gate electrodes are formed with the top surfaces respectively of the control, select, and dummy gate electrodes being uneven.

17. The method according to claim 16, wherein the control, select, and dummy gate electrodes are formed with bottom surfaces respectively of the control, select, and dummy gate electrodes being uneven.

18. The method according to claim 15, further comprising:

before forming the dielectric layer, forming a common source/drain region in the semiconductor substrate and individual source/drain regions of the select and control gates region in the semiconductor substrate, wherein the common source/drain region is formed between the select and control gate electrodes, and wherein the individual source/drain regions are respectively formed on an opposite side of the select gate electrode as the common source/drain and an opposite side of the control gate electrode as the common source/drain region.

19. The method according to claim 15, further comprising:

forming a high κ dielectric layer lining a bottom surface of the gate opening, wherein the high κ dielectric layer has a dielectric constant exceeding about 3.9, and wherein the second conductive layer is formed of metal and covering the high κ dielectric layer.

* * * * *